(12) United States Patent
Jang et al.

(10) Patent No.: US 8,080,813 B2
(45) Date of Patent: Dec. 20, 2011

(54) ION IMPLANTER, INTERNAL STRUCTURE OF ION IMPLANTER AND METHOD OF FORMING A COATING LAYER IN THE ION IMPLANTER

(75) Inventors: Kyung-Ic Jang, Daejeon (KR); Kyung-Hwan Ye, Gyeonggi-do (KR); Sam-Woong Kim, Gyeonggi-do (KR); Yong-Sup Reim, Gyeonggi-do (KR)

(73) Assignee: Komico Ltd. (KR)

( * ) Notice: Subject to any disclaimer, the term of this patent is extended or adjusted under 35 U.S.C. 154(b) by 95 days.

(21) Appl. No.: 12/667,303

(22) PCT Filed: Jul. 3, 2008

(86) PCT No.: PCT/KR2008/003930
§ 371 (c)(1),
(2), (4) Date: Dec. 30, 2009

(87) PCT Pub. No.: WO2009/008626
PCT Pub. Date: Jan. 15, 2009

(65) Prior Publication Data
US 2010/0327191 A1    Dec. 30, 2010

(30) Foreign Application Priority Data
Jul. 10, 2007    (KR) .................. 10-2007-0069036

(51) Int. Cl.
*H01J 37/08* (2006.01)
(52) U.S. Cl. ................................ 250/492.21
(58) Field of Classification Search ............ 250/492.21, 250/492.1; 134/1, 1.1, 1.2, 1.3, 2, 36
See application file for complete search history.

(56) References Cited

U.S. PATENT DOCUMENTS

| 4,003,770 | A  | * | 1/1977  | Janowiecki et al. ............ 438/97 |
| 6,120,660 | A  | * | 9/2000  | Chu et al. ................. 204/298.15 |
| 7,824,498 | B2 | * | 11/2010 | Parkhe et al. ................. 118/728 |
| 2005/0260354 | A1 | | 11/2005 | Singh et al. |

FOREIGN PATENT DOCUMENTS

| CN | 1977351 A | 6/2007 |
| JP | 05-326471 | 12/1993 |
| JP | 2001-007041 | 1/2001 |
| JP | 2002-343735 | 11/2002 |
| WO | WO 2005/114692 A3 | 12/2005 |

OTHER PUBLICATIONS

Letter dated Mar. 10, 2011 with Notice of first Office Action dated Feb. 11, 2011 for Chinese Application No. 200580020329, filed Jul. 3, 2008, 7 pages.
International Search Report PCT/KR2008/003930 dated Dec. 31, 2008, 3 pages.
Written Opinion of the International Searching Authority PCT/KR2008/003930 dated Dec. 31, 2008, 4 pages.

* cited by examiner

*Primary Examiner* — Kiet Nguyen
(74) *Attorney, Agent, or Firm* — Daly, Crowley, Mofford & Durkee, LLP

(57) ABSTRACT

An ion implanter includes a process chamber and a coating layer. The process chamber receives a substrate and provides a space to perform an ion implantation process on the substrate. The coating layer is disposed on an inner wall of the process chamber to reduce contamination of the substrate and includes the same material as that of the substrate.

10 Claims, 2 Drawing Sheets

[Fig. 1]
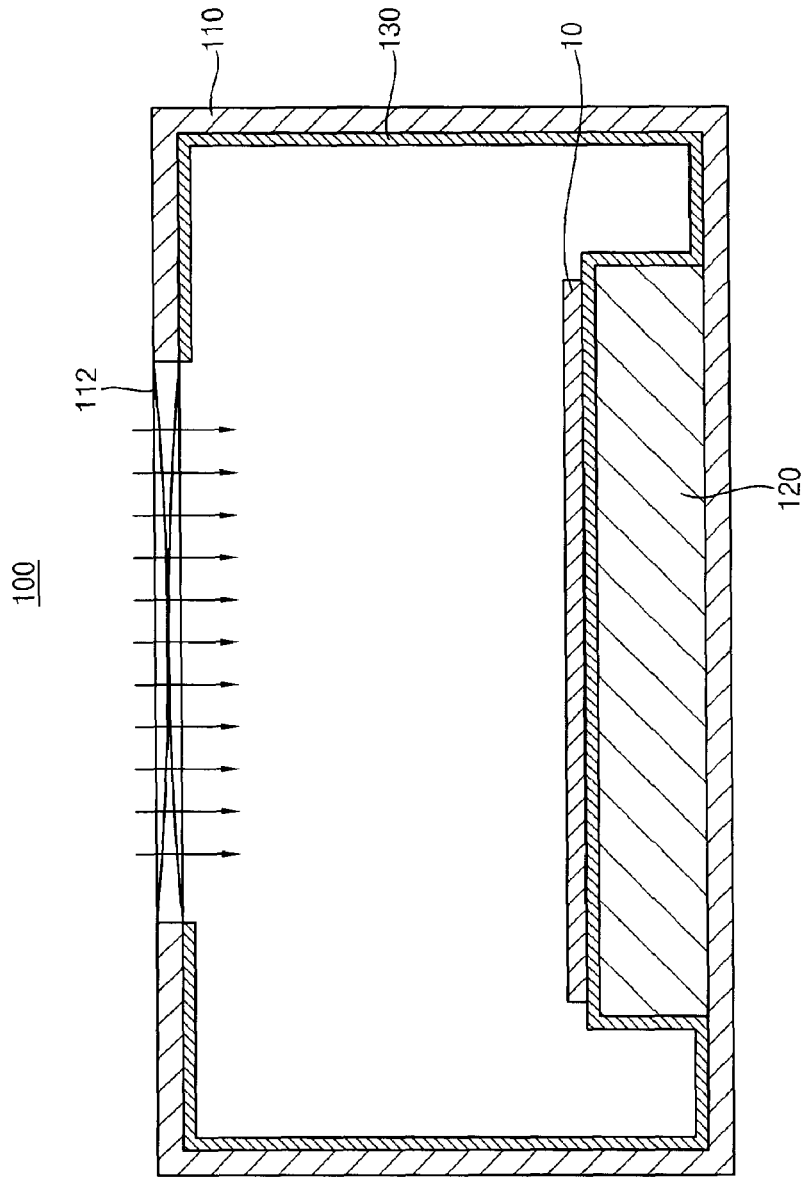
[Fig. 2]
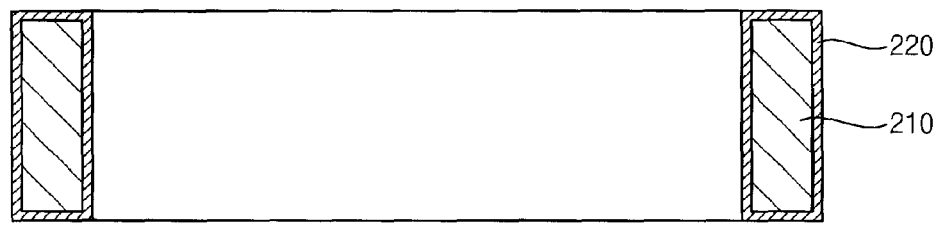

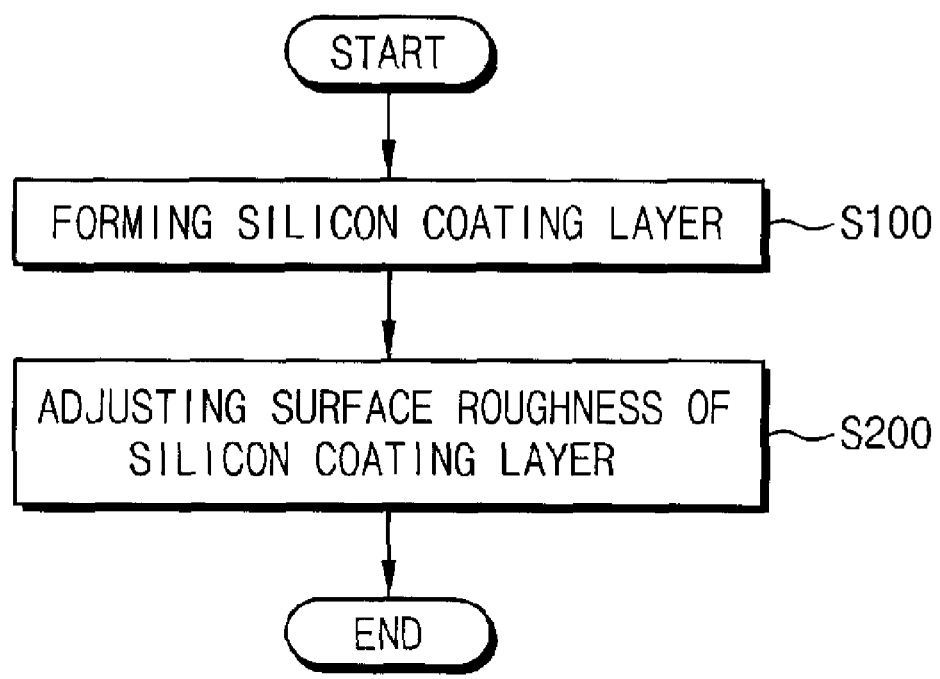

ION IMPLANTER, INTERNAL STRUCTURE OF ION IMPLANTER AND METHOD OF FORMING A COATING LAYER IN THE ION IMPLANTER

TECHNICAL FIELD

The present invention relates to an ion implanter, an internal structure of the ion implanter and a method of forming a coating layer in the ion implanter. More particularly, the present invention relates to an ion implanter for implanting ions into a substrate, an internal structure of the ion implanter and a method of forming a coating layer in the ion implanter.

BACKGROUND ART

An ion implantation may be performed to implant ions into a predetermined region of a substrate in a manufacturing process of a semiconductor device or a flat panel display. For example, an ion implantation may be performed to form source/drain regions at surface portions of a semiconductor substrate in a semiconductor manufacturing process.

An apparatus for performing the ion implantation process, i.e., an ion implanter, includes an ion generator for ionizing a source gas, an ion extractor for extracting ions from the ion generator, a mass spectrometer for selecting desired ions among the extracted ions, an accelerator for accelerating the selected ions so as to have a predetermined amount of energy and thereby forming an ion beam, an ion deflector for adjusting the direction of the ion beam so that the ion beam scans a surface of a substrate, which is disposed in a process chamber, a support for supporting the substrate, etc.

In the ion implanter, impurities, for example, particles produced by collision between the ions and the substrate and ions which are not implanted into the substrate but scattered in the process chamber, may be attached to an inner wall of the process chamber. The attached impurities may serve as a contamination source. That is, the impurities may be separated from the inner wall and may contaminate the substrate. Thus, a cleaning process on the inner wall may be performed to remove the attached impurities. As a result, the time required to perform the ion implantation process may be increased, thereby deteriorating the efficiency of the ion implantation process.

To solve the above-described problems, a ceramic spray-coating layer may be formed on the inner wall of the process chamber. The ceramic spray-coating layer may include aluminum oxide (Al2O3) or yttrium oxide (Y2O3). The ceramic spray-coating layer may be formed to allow the impurities to be easily adsorbed thereto.

However, the ceramic spray-coating layer may be easily corroded by the adsorbed impurities, another impurities including aluminum or yttrium may be produced from the corroded ceramic spray-coating layer. As a result, the substrate may be contaminated by the impurities including aluminum or yttrium. Further, because the ceramic spray-coating layer has relatively high surface resistance, electric arcing may occur during the ion implantation process.

DISCLOSURE OF INVENTION

Technical Problem

Example embodiments of the present invention provide an ion implanter capable of adsorbing impurities produced during an ion implantation process and reducing contamination of a substrate.

Further, example embodiments of the present invention provide an internal structure of an ion implanter capable of adsorbing impurities produced during an ion implantation process and reducing contamination of a substrate.

Still further, example embodiments of the present invention provide a method of forming a coating layer of an ion implanter capable of adsorbing impurities produced during an ion implantation process and reducing contamination of a substrate.

Technical Solution

In accordance with an aspect of the present invention, an ion implanter may include a process chamber providing a space to receive a substrate and to perform an ion implantation process on the substrate, and a coating layer disposed on a surface of an inner wall or an internal member which is disposed in the process chamber to prevent contamination of the substrate and comprising the same material as that of the substrate disposed in the process chamber.

In some example embodiments of the present invention, the coating layer may have a predetermined surface roughness. Particularly, the coating layer may have an average roughness in a range of about 4 to about 8 μm.

In some example embodiments of the present invention, a thickness of the coating layer may be in a range of about 100 to 1,000 μm.

In some example embodiments of the present invention, the coating layer may include silicon.

In accordance with another aspect of the present invention, an internal structure of an ion implanter may include an internal member disposed in a process chamber in which an ion implantation process on a substrate is performed, and a coating layer disposed on a surface of the internal member and comprising the same material as that of the substrate.

In some example embodiments of the present invention, the coating layer may include silicon.

In a method of forming a coating layer in an ion implanter according to still another aspect of the present invention, a coating layer may be formed on an inner wall of a process chamber and a surface roughness of the coating layer may then be adjusted. The coating layer may include the same material as that of a substrate to be subjected to an ion implantation in the process chamber.

In some example embodiments of the present invention, the coating layer may be formed by melting a silicon powder and spraying the melted silicon powder toward the inner wall of the process chamber. The silicon powder may have a degree of purity higher than about 99% and a particle size in a range of about 30 to about 100 μm.

In some example embodiments of the present invention, the coating layer has an average roughness in a range of about 4 to about 8 μm.

In some example embodiments of the present invention, the coating layer may be formed at atmospheric pressure or a pressure lower than the atmospheric pressure.

In some example embodiments of the present invention, the coating layer may have a thickness in a range of about 100 to about 1,000 μm.

Advantageous Effects

According to the example embodiments of the present invention, a coating layer including silicon may be formed on a surface of an inner wall or an internal member of a process chamber. The formation rate of the coating layer may be increased and the thickness of the coating layer may be easily adjusted. The adhesive force between the coating layer and the process chamber may be increased in comparison with a conventional art using a ceramic coating layer. Contamination of a substrate due to the coating layer may be reduced because the coating layer is formed of the same material as that of the substrate. Impurities produced during an ion implantation process may be easily adsorbed to the coating layer because the coating layer has a predetermined surface roughness. The occurrence of electric arcing may be reduced because the surface resistance of the coating layer is relatively low in comparison with that of the conventional ceramic coating layer.

BRIEF DESCRIPTION OF THE DRAWINGS

Example embodiments of the present invention will become readily apparent along with the following detailed description when considered in conjunction with the accompanying drawings, wherein:

FIG. 1 is a cross-sectional view illustrating an ion implanter according to an example embodiment of the present invention;

FIG. 2 is a cross-sectional view illustrating an internal structure of an ion implanter according to another example embodiment of the present invention; and FIG. 3 is a flowchart illustrating a method of forming a coating layer in an ion implanter according to still another example embodiment of the present invention.

BEST MODE FOR CARRYING OUT THE INVENTION

Embodiments of the invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompass both an orientation of "lower" and "upper" depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

FIG. 1 is a cross-sectional view illustrating an ion implanter according to an example embodiment of the present invention.

Referring to FIG. 1, an ion implanter 100 may include a process chamber 110, a support 120 and a coating layer 130.

The process chamber 110 may receive a substrate 10 and may provide a space to perform an ion implantation process on the substrate 10. The substrate 10 may be a semiconductor substrate for forming semiconductor devices or a glass substrate for forming flat panel display devices. The substrate 10 may be a silicon substrate or a substrate formed of a material including silicon. The process chamber 110 may have an opening 112 through which ions may be introduced from an ion source into the process chamber 110.

The support 120 may be disposed opposite to the opening 112 in the process chamber 110. The support 120 may support the substrate 10 to face a surface of the substrate 10 toward the opening 112.

Though not shown in the figures, internal members, for example, a liner, a baffle, a shield ring, etc., may be disposed in the process chamber 110.

The coating layer 130 may be disposed on inner walls of the process chamber 110. Further, the coating layer 130 may be disposed on surfaces of the support 120 and the internal members. The coating layer 130 may include the same material as that of the substrate 10. For example, the coating layer may include silicon having a degree of purity higher than about 99%. The silicon may have an adhesive force greater than a ceramic material. Thus, the coating layer 130 may be strongly fixed on the inner walls on the process chamber 110 so as not to fall off the inner walls of the process chamber 110.

Most of the ions may be implanted into the substrate 10 during the ion implantation process. However, some of the ions may be scattered in the process chamber 110. The scattered ions may be collided against the coating layer 130 on the inner walls, and thus impurities, for example, silicon particles, may fall on the surface of the substrate 10 from the coating layer 130. However, because the coating layer 130 is formed of the same material as that of the substrate 10, the substrate 10 may not be contaminated by the silicon particles from the coating layer 130.

Further, the coating layer 130 may have a predetermined surface roughness. For example, the coating layer 130 may have an average roughness in a range of about 4 to about 8 μm. Particularly, the coating layer 130 may have an average roughness in a range of about 4 to about 6 μm. When the coating layer 130 has an average roughness greater than about 8 μm, the coating layer 130 may be peeled off the inner walls, and the peeled portions of the coating layer 103 may fall on the substrate 10.

Because the coating layer 130 has the predetermined surface roughness, impurities, which include the scattered ions and substrate components produced by collision between the ions and the substrate 10, may be easily adsorbed to the coating layer 130. Thus, contamination of the substrate 10 due to the impurities may be reduced.

The coating layer 130 may have a thickness in a range of about 100 to about 1,000 μm. Particularly, the coating layer 130 may have a thickness in a range of about 400 to about 600 μm. When the coating layer 130 has a thickness less than about 100 μm, it may be difficult to adjust the thickness of the coating layer 103. Further, when the coating layer 130 has a thickness more than about 1,000 μm, the time required to form the coating layer 130 may be increased.

Though not shown in the figures, the ion source may provide the ions into the substrate 10 through the opening 112 of the process chamber 110. The ion source may include an ion generator for generating the ions from a source gas, an ion extractor for extracting the ions from the ion generator and for forming the ion beam, a charge exchanger for converting the polarity of the ion beam formed by the ion extractor from positive to negative, a mass analyzer for selecting specific ions from the negative ion beam, an accelerator for accelerating the negative ion beam composed of the specific ions and for converting the negative ion beam into a positive ion beam, a focusing magnet for focusing the positive ion beam accelerated by accelerator onto the substrate 10, an ion deflector for adjusting the direction of the focused ion beam directed from the focusing magnet, an ion current measurement section for measuring an ion current of the ion beam, etc.

The ion generator may be an arc discharge type ion generator. The arc discharge type ion generator may include an arc chamber and a filament. The source gas may collide with thermal electrons discharged from the filament to generate ions. In addition, ion generators of various types, such as a radio frequency type, a duoplasmatron type, a cold cathode type, a sputter type, a penning ionization type, and the like, may be used.

The charge exchanger may include solid magnesium, which is used as an electron supply material, and a heater. The heater may heat the solid magnesium to a temperature of about 450° C. so that gaseous magnesium molecules may be generated from the solid magnesium. The ion beam extracted by the ion extractor may collide with the gaseous magnesium molecules. Then, the ion beam may receive electrons from the gaseous magnesium molecules and may consequently acquire a negative net charge.

The mass analyzer may select the specific ions from the negative ion beam. The negative ion beam composed of the specific ions is then directed in the accelerator.

The focusing magnet may focus the ion beam accelerated by the accelerator onto the substrate 10. The ion deflector may adjust the direction of the focused ion beam so that the focused ion beam scans the entire substrate 10.

FIG. 2 is a cross-sectional view illustrating an internal structure of an ion implanter according to another example embodiment of the present invention.

Referring to FIG. 2, an internal structure 200 of an ion implanter may include an internal member 210 and a coating layer 220.

The internal member 210 may be disposed in a process chamber (not shown). The process chamber may receive a substrate and may provide a space to perform an ion implantation process on the substrate. The substrate may be a semiconductor substrate for forming semiconductor devices or a glass substrate for forming flat panel display devices. The substrate may be a silicon substrate or may be formed of a material including silicon. Examples of the internal member 210 may include a liner of the process chamber, a baffle, a shield ring, and the like. The liner of the process chamber may be provided to prevent damage to the process chamber caused by ions or a source gas introduced into the process chamber. The shield ring may be disposed on an edge portion of a support, on which the substrate is placed, to prevent damage to the support caused by the ions or the source gas. Another example of the internal member 210 may include inner walls of the process chamber.

The coating layer 220 may be disposed on surfaces of the internal member 210. For example, the coating layer 220 may be disposed on surfaces of the liner, the baffle, the shield ring and the inner walls of the process chamber.

Further detailed descriptions of the coating layer 220 will be omitted because the coating layer 220 is similar to the coating layer 130 already described with reference to FIG. 1.

The internal structure 200 may be disposed in the process chamber and may reduce damage to the support and the process chamber. Further, the internal structure 200 may reduce contamination of the substrate.

FIG. 3 is a flowchart illustrating a method of forming a coating layer in an ion implanter according to still another example embodiment of the present invention.

Referring to FIGS. 1 and 3, a coating layer 130 may be formed on surfaces of inner walls or internal members of a process chamber 110 of an ion implanter 100 in step S100.

The coating layer 130 may include the same material as that of a substrate 10 to be subjected to an ion implantation process in the process chamber 110. For example, the coating layer 130 may include silicon.

In detail, a silicon powder may be prepared. The silicon powder may have a degree of purity higher than about 99% and a particle size in a range of about 30 to about 100 μm. The silicon powder may be melted by using a high temperature plasma flame. A temperature of the plasma flame may be in a range of about 5,000 to about 15,000° C.

When the particle size of the silicon powder is smaller than about 30 μm, it may be difficult to supply the silicon powder to a plasma gun that may be used to generate the plasma flame. Further, when the particle size of the silicon powder is greater than about 100 μm, the silicon powder may not be sufficiently melted by the plasma flame, and thus unmelted silicon clumps may be produced. The unmelted silicon clumps may function as a contamination source in the process chamber 110.

The melted silicon powder may be sprayed toward the inner walls or the internal members of the process chamber 110.

For example, the melted silicon powder may be sprayed at high speed by a high pressure gas. For example, a purified air or an inert gas may be used to spray the melted silicon powder. The melted silicon powder may be sprayed at a speed of about 200 to about 700 m/s. The melted silicon powder may have a relatively high adhesive force and may strongly adhere to the inner walls or the internal members of the process chamber 110. Thus, the coating layer 130 may not be separated from the inner walls or the internal members of the process chamber 110.

The steps of melting the silicon powder and spraying the melted silicon powder to form the coating layer 130 may be performed under atmospheric pressure or a pressure lower than the atmospheric pressure.

As described above, because the coating layer 130 is formed by melting the silicon powder and spraying the melted silicon powder, the time required to form the coating layer 130 may be shortened and a thickness of the coating layer 130 may be easily adjusted.

The coating layer 130 may have a thickness in a range of about 100 to about 1,000 μm. Particularly, the coating layer 130 may have a thickness in a range of about 400 to about 600 μm. Further, the coating layer 130 may have a porosity in a range of about 2 to about 10%.

When the porosity of the coating layer 130 is smaller than about 2%, the coating layer 130 may be vulnerable to thermal shock and cracks may occur during the ion implantation process. Further, when the porosity of the coating layer 130 is greater than about 10%, the coating layer 130 may be peeled off, and the peeled portions of the coating layer 130 may be introduced onto the substrate 10 and may function as a contamination source.

The coating layer 130 may be ground or polished to adjust a surface roughness of the coating layer 130 in step S200.

The grinding or polishing step may be performed until the coating layer 130 has a predetermined surface roughness. For example, the grinding or polishing step may be performed until the coating layer 130 has an average roughness of about 4 to about 8 μm. Particularly, the grinding or polishing step may be performed until the coating layer 130 has an average roughness of about 4 to about 6 μm. Thus, impurities, which include ions scattered in the process chamber 110 and substrate components produced by collision between ions and the substrate 10 during the ion implantation process, may be easily adsorbed to the coating layer 130, thereby preventing contamination of the substrate 10 due to the impurities.

The coating layer 130 may be ground by using a nonwoven fabric including aluminum oxide. However, when the coating layer 130 formed by spraying the melted silicon powder essentially has the predetermined surface roughness, the grinding step may be unnecessary.

Meanwhile, a method of forming the coating layer 220 on the internal member to manufacture the internal structure 200 as shown in FIG. 2 is similar to the method of the coating layer in the ion implanter described above with reference to FIG. 3.

INDUSTRIAL APPLICABILITY

According to the example embodiments of the present invention as described above, a coating layer including silicon may be formed on a surface of an inner wall or an internal member of a process chamber. The formation rate of the coating layer may be increased and the thickness of the coating layer may be easily adjusted. The adhesive force between the coating layer and the process chamber may be increased in comparison with a conventional art using a ceramic coating layer. Contamination of a substrate due to the coating layer may be reduced because the coating layer is formed of the same material as that of the substrate. Impurities produced during an ion implantation process may be easily adsorbed to the coating layer because the coating layer has a predetermined surface roughness. The occurrence of electric arcing may be reduced because the surface resistance of the coating layer is relatively low in comparison with that of the conventional ceramic coating layer.

Although the example embodiments of the present invention have been described, it is understood that the present invention should not be limited to these example embodiments but various changes and modifications can be made by those skilled in the art within the spirit and scope of the present invention as hereinafter claimed.

The invention claimed is:

1. An ion implanter comprising:
    a process chamber providing a space to receive a substrate and to perform an ion implantation process on the substrate; and
    a coating layer disposed on a surface of an inner wall or an internal member which is disposed in the process chamber to prevent contamination of the substrate and comprising a same material as that of the substrate disposed in the process chamber,
    wherein the coating layer has a predetermined surface roughness, and
    wherein the coating layer has an average roughness in a range of about 4 to about 8 μm.

2. The ion implanter of claim 1, wherein a thickness of the coating layer is in a range of about 100 to 1,000 μm.

3. The ion implanter of claim 1, wherein the coating layer comprises silicon.

4. An internal structure of an ion implanter comprising:
    an internal member disposed in a process chamber in which an ion implantation process on a substrate is performed; and
    a coating layer disposed on a surface of the internal member and comprising a same material as that of the substrate,
    wherein the coating layer has an average roughness in a range of about 4 to about 8 μm.

5. The internal structure of claim 4, wherein the coating layer comprises silicon.

6. A method of forming a coating layer in an ion implanter comprising:
    forming a coating layer on an inner wall of a process chamber, the coating layer comprising a substantially same material as that of a substrate to be subjected to an ion implantation in the process chamber; and
    adjusting a surface roughness of the coating layer,
    wherein the coating layer has an average roughness in a range of about 4 to about 8 μm.

7. The method of claim 6, wherein forming the coating layer comprises:
   melting a silicon powder; and
   spraying the melted silicon powder toward the inner wall of the process chamber.

8. The method of claim 7, wherein the silicon powder has a degree of purity higher than about 99% and a particle size in a range of about 30 to about 100 μm.

9. The method of claim 6, wherein forming the coating layer is performed under atmospheric pressure or a pressure lower than the atmospheric pressure.

10. The method of claim 6, wherein the coating layer has a thickness in a range of about 100 to about 1,000 μm.

* * * * *